United States Patent
Kushibiki et al.

(10) Patent No.: US 11,309,474 B2
(45) Date of Patent: Apr. 19, 2022

(54) THERMOELECTRIC MODULE

(71) Applicant: KELK Ltd., Kanagawa (JP)

(72) Inventors: Shunsuke Kushibiki, Kanagawa (JP);
Masato Horikoshi, Kanagawa (JP);
Hideaki Ohkubo, Kanagawa (JP)

(73) Assignee: KELK Ltd., Kanagawa (JP)

(*) Notice: Subject to any disclaimer, the term of this patent is extended or adjusted under 35 U.S.C. 154(b) by 0 days.

(21) Appl. No.: 16/621,102

(22) PCT Filed: May 9, 2018

(86) PCT No.: PCT/JP2018/017917
§ 371 (c)(1),
(2) Date: Dec. 10, 2019

(87) PCT Pub. No.: WO2018/230199
PCT Pub. Date: Dec. 20, 2018

(65) Prior Publication Data
US 2020/0168778 A1    May 28, 2020

(30) Foreign Application Priority Data
Jun. 14, 2017   (JP) .............................. JP2017-116650

(51) Int. Cl.
*H01L 35/10*     (2006.01)
*F25B 21/02*     (2006.01)
(Continued)

(52) U.S. Cl.
CPC .............. *H01L 35/10* (2013.01); *B29C 43/02* (2013.01); *F25B 21/02* (2013.01); *H01L 31/022433* (2013.01); *H01L 31/0508* (2013.01)

(58) Field of Classification Search
CPC . H01L 35/10; H01L 35/32; H01L 31/022433; H01L 31/0508; H01L 35/04;
(Continued)

(56) References Cited

U.S. PATENT DOCUMENTS 6,073,449 A    6/2000  Watanabe et al.
2009/0159116 A1*  6/2009  Umetani ............. H01L 31/0508
                                                     136/251
(Continued)

FOREIGN PATENT DOCUMENTS

JP         10-12934        1/1998
JP         2007266444     10/2007
(Continued)

OTHER PUBLICATIONS

PCT International Search Report in Appln. No. PCT/JP2018/017917, dated Jul. 31, 2018, 4 pages (with English translation).
(Continued)

*Primary Examiner* — Michael Y Sun
(74) *Attorney, Agent, or Firm* — Fish & Richardson P.C.

(57) ABSTRACT

A thermoelectric module of the invention includes: first and second thermoelectric elements; a first electrode having a plate-shaped body whose first surface is bonded to a first end surface of the first thermoelectric element and a first end surface of the second thermoelectric element; a second electrode bonded to a second end surface of the first thermoelectric element; and a third electrode bonded to a second end surface of the thermoelectric element. The first electrode includes: a first cutout formed at a first side in a width direction; and a second cutout formed at a second side in the width direction. In the width direction, at least one of the first cutout or the second cutout is present in a section between the first side and the second side of the first electrode.

14 Claims, 8 Drawing Sheets

(51) Int. Cl.
*B29C 43/02* (2006.01)
*H01L 31/05* (2014.01)
*H01L 31/0224* (2006.01)

(58) Field of Classification Search
CPC ........... H01L 21/3065; H01L 21/67248; H01L 21/6831; H02N 11/00; F25B 21/02; B29C 43/02

See application file for complete search history.

(56) References Cited

U.S. PATENT DOCUMENTS

| | | | | |
|---|---|---|---|---|
| 2010/0018562 | A1* | 1/2010 | Kurahashi | H01L 31/022433 136/244 |
| 2014/0150463 | A1 | 6/2014 | Kiyosawa et al. | |
| 2014/0345666 | A1 | 11/2014 | Konnai et al. | |
| 2016/0049570 | A1* | 2/2016 | Okuzono | H01L 35/04 136/212 |
| 2018/0323358 | A1* | 11/2018 | Tollefsen | H01L 35/08 |

FOREIGN PATENT DOCUMENTS

| | | |
|---|---|---|
| JP | 2012-253170 | 12/2012 |
| JP | 2013-145848 | 7/2013 |
| JP | 2014-112587 | 6/2014 |
| JP | 2015-56507 | 3/2015 |
| JP | 2015-177048 | 10/2015 |
| JP | 2015177048 A * | 10/2015 |

OTHER PUBLICATIONS

International Preliminary Report on Patentability in PCT Appln. No. PCT/JP2018/017917, dated Dec. 17, 2019, 7 pages, English translation.

Korean Notice of Allowance in Korean Appln. No. 10-2019-7036581, dated Mar. 31, 2021, 3 pages (with English translation).

* cited by examiner

THERMOELECTRIC MODULE

CROSS-REFERENCE TO RELATED APPLICATIONS

This application claims priority to International Application No. PCT/JP2018/017917 filed on May 9, 2018, which claims priority to Japanese Application No. 2017-116650, filed on Jun. 14, 2017, the contents of which are incorporated herein in their entirety.

TECHNICAL FIELD

The present invention relates to a thermoelectric module.

BACKGROUND ART

In general, a thermoelectric module includes: thermoelectric elements; and electrodes bonded to respective end surfaces of each of the thermoelectric elements, in which adjacent ones of the thermoelectric elements are mutually electrically connected by the electrodes. Such a thermoelectric module is disclosed in, for instance, Patent Literature 1. Patent Literature 1 specifically proposes a thermoelectric module capable of preventing concentration of thermal stress at four corners of each of the end surfaces of each of the thermoelectric elements with an increased area of the electrodes bonded to the end surfaces of each of the thermoelectric elements.

CITATION LIST

Patent Literature(s)

Patent Literature 1: JP 2014-112587 A

SUMMARY OF THE INVENTION

Problems to be Solved by the Invention

As disclosed in Patent Literature 1, when the thermoelectric module is energized, a heat absorbing phenomenon occurs at one surface of the thermoelectric module to cool the corresponding electrode while a heat radiating phenomenon occurs at the other surface of the thermoelectric module to heat the corresponding electrode. Patent Literature 1 proposes preventing concentration of thermal stress by disposing the electrode on a heat absorbing side in a manner to be spaced from four corners of the corresponding end surface of each of thermoelectric elements.

However, Patent Literature 1 only proposes the technique for preventing concentration of thermal stress, for instance, at four corners of a rectangular end surface of the thermoelectric element but fails to propose a countermeasure against thermal stress at parts other than the corners. For instance, a technique of a countermeasure against thermal expansion occurring due to thermal expansion of the electrode caused by being heated at a heat-radiation side of the thermoelectric module is not proposed in typical techniques including Patent Literature 1.

In light of the above, an object of the invention is to provide a thermoelectric module capable of reducing stress occurring at joint portions between thermoelectric elements and electrodes due to thermal expansion of one of the electrodes.

Means for Solving the Problems

A thermoelectric module according to an aspect of the invention includes: a first thermoelectric element and a second thermoelectric element; a first electrode including a plate-shaped body whose first surface is bonded to a first end surface of the first thermoelectric element and a first end surface of the second thermoelectric element, the first electrode that electrically connects the first thermoelectric element to the second thermoelectric element; a second electrode bonded to a second end surface of the first thermoelectric element opposite the first end surface thereof; and a third electrode bonded to a second end surface of the second thermoelectric element opposite the first end surface thereof, in which the first electrode includes: a first cutout formed at a first side in a width direction with respect to a longitudinal direction connecting a center of the first end surface of the first thermoelectric element to a center of the first end surface of the second thermoelectric element; and a second cutout formed at a second side in the width direction, and in the width direction, at least one of the first cutout or the second cutout is present in a section between the first side and the second side of the first electrode.

According to the above aspect of the invention, since the thermal stress occurring due to the thermal expansion of the electrode is absorbed by deformation at the cutouts formed at opposing sides of the electrode in the width direction, stress occurring at the joint portion between the thermoelectric elements and the electrodes is reducible.

DESCRIPTION OF EMBODIMENT(S)

Figure 1:
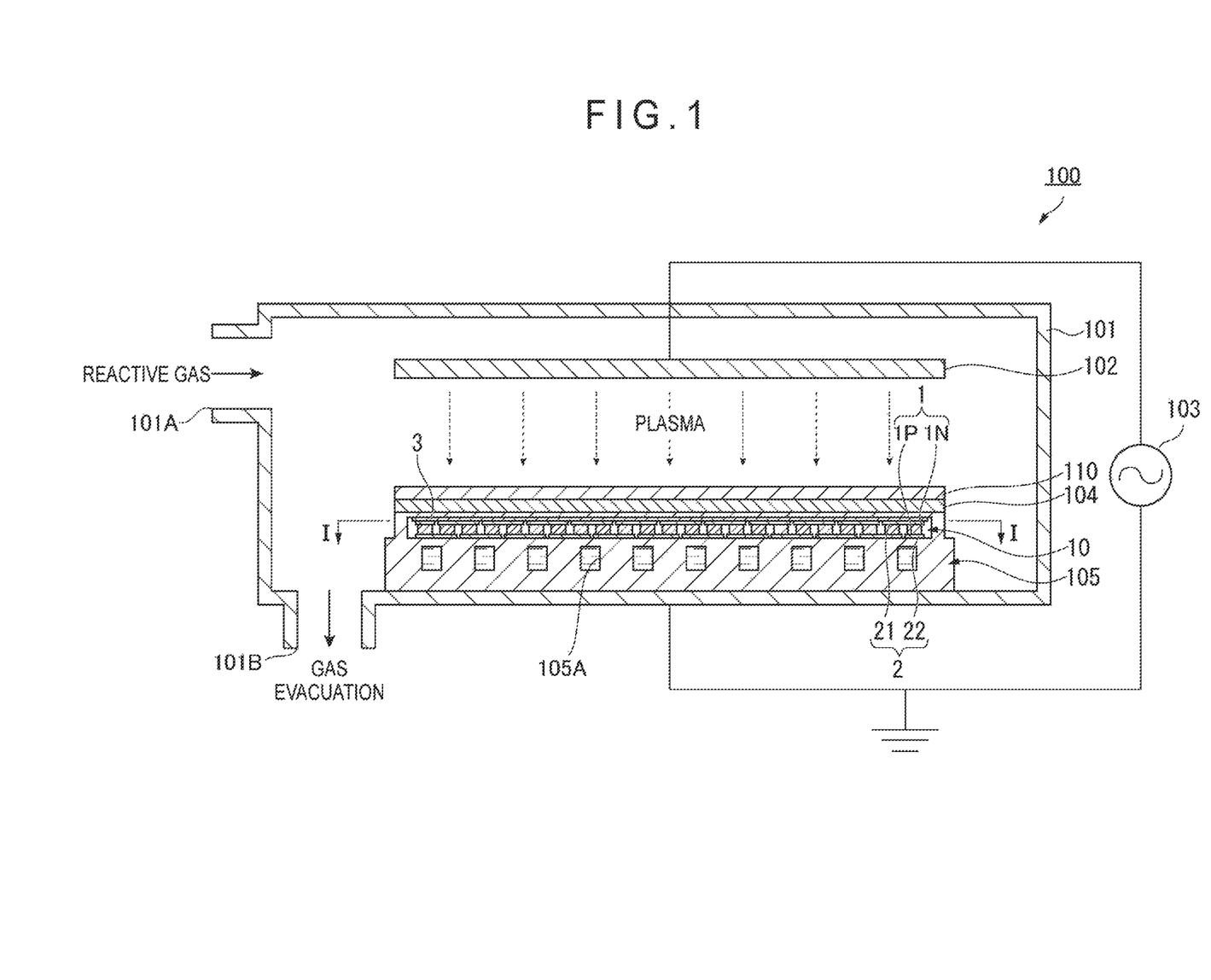
FIG. 1 illustrates a plasma processor including a thermoelectric module according to an exemplary embodiment of the invention.

FIG. 1 illustrates a plasma processor 100 including a thermoelectric module 10 according to an exemplary embodiment of the invention. The plasma processor 100 includes the thermoelectric module 10, a chamber 101, a plasma electrode 102, a high-frequency oscillator 103, an electrostatic chuck 104, and a water-cooling plate 105. As exemplarily illustrated, a silicon wafer 110 is sucked by the electrostatic chuck 104 inside the chamber 101.

The plasma electrode 102 is disposed facing the silicon wafer 110 sucked by the electrostatic chuck 104 inside the chamber 101. The electrostatic chuck 104 sucks the silicon wafer 110 with an upper surface (i.e., a surface (side) facing upward: hereinafter the same explanation applies to the terms of "upper surface (side)" and "lower surface (side)").

A lower surface of the electrostatic chuck 104 is provided with the thermoelectric module 10 and the water-cooling plate 105. The water-cooling plate 105 has a pipe 105A in which a cooling liquid is circulated.

The thermoelectric module 10, which is disposed between the electrostatic chuck 104 and the water-cooling plate 105, includes thermoelectric elements 1, electrodes 2, and a polyimide film 3. The thermoelectric elements 1 include P-type thermoelectric elements 1P and N-type thermoelectric elements 1N that are alternately arranged with opposing surfaces respectively facing the upper surface and the lower surface of the thermoelectric module 10. The electrodes 2 are bonded to the end surfaces of each of the P-type thermoelectric elements 1P and the N-type thermoelectric elements 1N, whereby the P-type thermoelectric elements 1P and the N-type thermoelectric elements 1N are electrically connected to each other.

The electrodes 2 include upper electrodes 21 (hereinafter, one of which is sometimes referred to as the upper electrode 21) disposed at an upper side of the thermoelectric module 10 and lower electrodes 22 (hereinafter, one of which is sometimes referred to as the lower electrode 22) disposed at a lower side of the thermoelectric module 10. In the exemplary embodiment, with reference to the arrangement of the plasma processor 100 as shown in FIG. 1, a first electrode is defined as the upper electrode 21, and second and third electrodes are defined as the lower electrode 22. However, in some embodiments, the arrangement of the thermoelectric module 10 may be reversed from the arrangement shown in FIG. 1: the first electrode may be the lower electrode, and the second and third electrodes may be the upper electrode. Alternatively, the thermoelectric module 10 may be arranged such that the first electrode is opposed to the second and third electrodes across the thermoelectric elements not vertically but horizontally or diagonally. The polyimide film 3 is disposed at the upper side of the thermoelectric module 10 and is bonded on the upper electrode 21. Since polyimide is an easily deformable material, the upper electrode 21 can thermally expand while deforming the polyimide film 3. The lower electrode 22 is fixed to a substrate on the lower side of the thermoelectric module 10.

The P-type thermoelectric elements 1P and the N-type thermoelectric elements 1N, whose combination order differs depending on the upper electrode 21 and the lower electrode 22, are electrically connected by the upper electrode 21 and the lower electrode 22, thereby forming a series circuit in which the P-type thermoelectric elements 1P and the N-type thermoelectric elements 1N are alternately connected to each other. When operating the thermoelectric module 10, a heat absorbing phenomenon can occur at the upper electrode 21 and a heat radiating phenomenon can occur at the lower electrode 22 by applying an electric current to the series circuit. Moreover, by inversing a direction of the electric current to be applied, the heat radiating phenomenon can occur at the upper electrode 21 and the heat absorbing phenomenon can occur at the lower electrode 22. Thus, a temperature of the silicon wafer 110 sucked by the electrostatic chuck 104 is controllable by causing the heat absorbing phenomenon and the heat radiating phenomenon.

In the plasma processor 100, after the silicon wafer 110 is sucked by the electrostatic chuck 104, reactive gas for generating plasma is introduced into the plasma processor 100 through an inlet 101A of the chamber 101, and the high-frequency oscillator 103 applies a high-frequency wave to the plasma electrode 102, thereby generating plasma. The silicon wafer 110 is processed (e.g., etched) by this plasma. Subsequently, the reactive gas is evacuated from an outlet 101B of the chamber 101.

During the plasma processing as described above, a yield of the plasma processing is improvable by controlling the temperature of the silicon wafer 110 to a target temperature. In the plasma processor 100, the temperature of the silicon wafer 110 sucked by the electrostatic chuck 104 is controlled by causing the heat absorbing phenomenon and the heat radiating phenomenon in the thermoelectric module 10 as described above.

Figure 2:
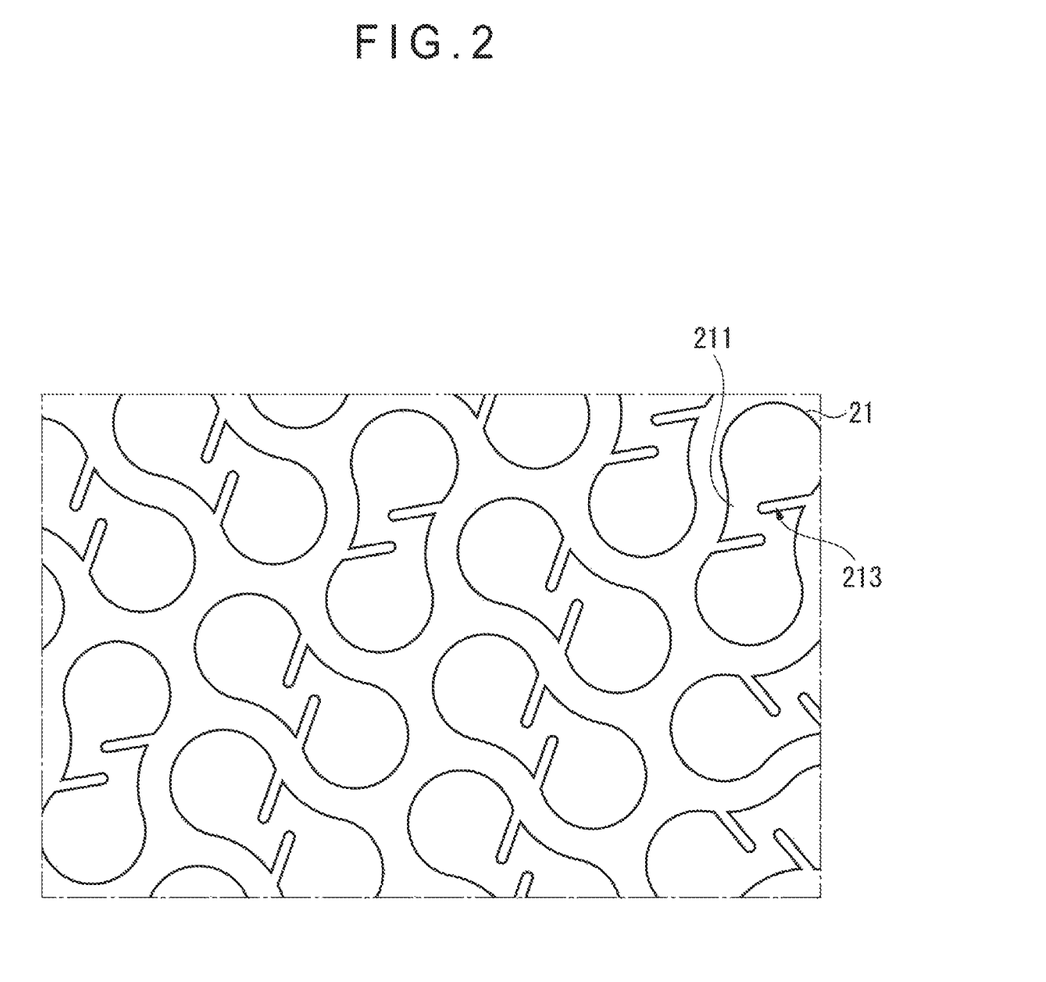
FIG. 2 illustrates an exemplary plane arrangement of an upper electrode in the thermoelectric module according to the exemplary embodiment of the invention.

FIG. 2 illustrates an exemplary plane arrangement of the upper electrodes 21 in the thermoelectric module 10 according to the exemplary embodiment of the invention. FIG. 2 illustrates a partial plane arrangement of the upper electrodes 21 viewed at a cross section taken along I-I line of the thermoelectric module 10 shown in FIG. 1. It should be noted that the thermoelectric elements 1 and the lower electrode 22 are not shown in FIG. 2. As shown in FIG. 2, the upper electrodes 21 are arranged in two dimensions. Each upper electrode 21 has a plate-shaped body 211. As described later, a cutout 213 is formed at each of opposing sides of the body 211 in a width direction.

Figure 3:
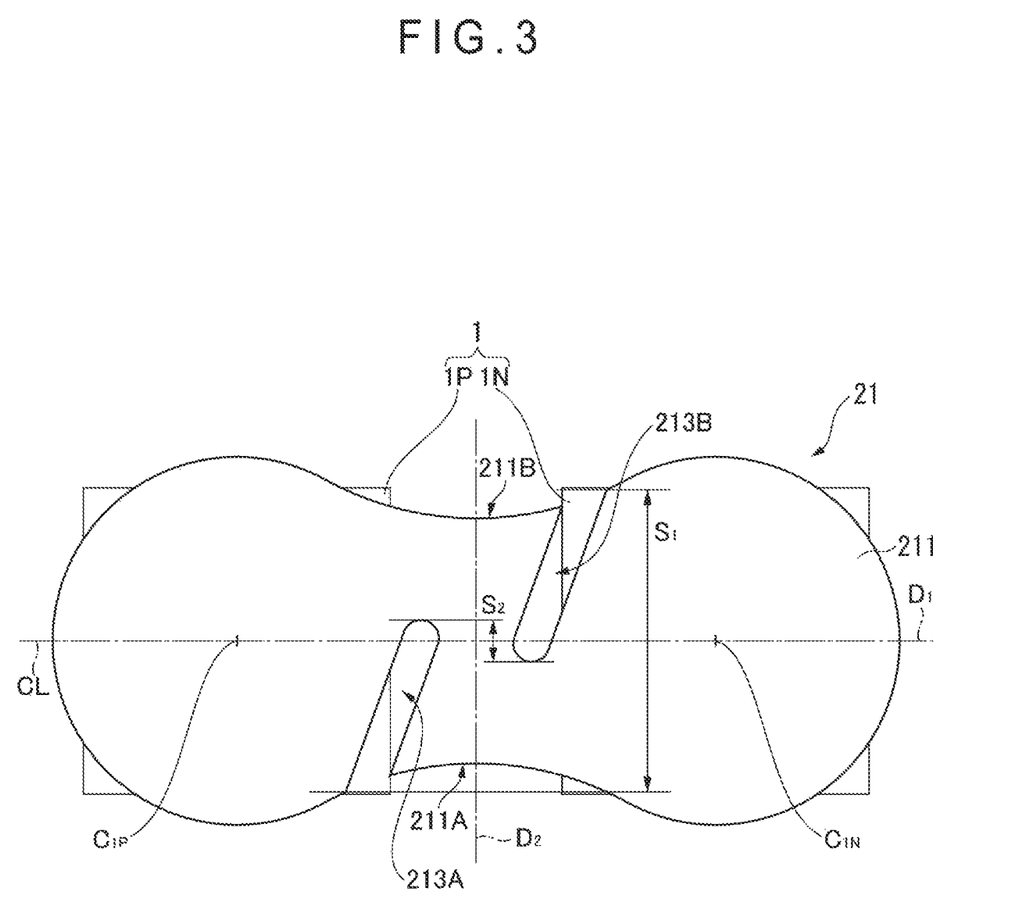
FIG. 3 is an enlarged view of a shape of the upper electrode shown in FIG. 2.

FIG. 3 is an enlarged view of a shape of the upper electrode 21 shown in FIG. 2. FIG. 3 also shows each one of the P-type thermoelectric elements 1P and the N-type thermoelectric elements 1N bonded to the upper electrode 21. Provided that a direction of a line connecting centers $C_{1P}$ and $C_{1N}$ of the respective end surfaces of the thermoelectric elements 1 is defined as a longitudinal direction $D_1$, the upper electrode 21 includes: a slit cutout 213A formed at a first side 211A in a width direction $D_2$ with respect to the longitudinal direction $D_1$; and a slit cutout 213B formed at a second side 211B in the width direction $D_2$.

Herein, as shown in the figure, the cutouts 213A and 213B extend to a center line CL (in alignment with the line representing the longitudinal direction $D_1$) of the upper electrode 21 in the width direction $D_2$. In other words, at least one of the cutout 213A or the cutout 213B is present in a section $S_1$ between the first side 211A and the second side 211B of the upper electrode 21 in the width direction $D_2$. Further, in an illustrated example in the figure, both of the cutout 213A and the cutout 213B are present in a partial section $S_2$ between the first side 211A and the second side 211B of the upper electrode 21 in the width direction $D_2$.

Figure 4:
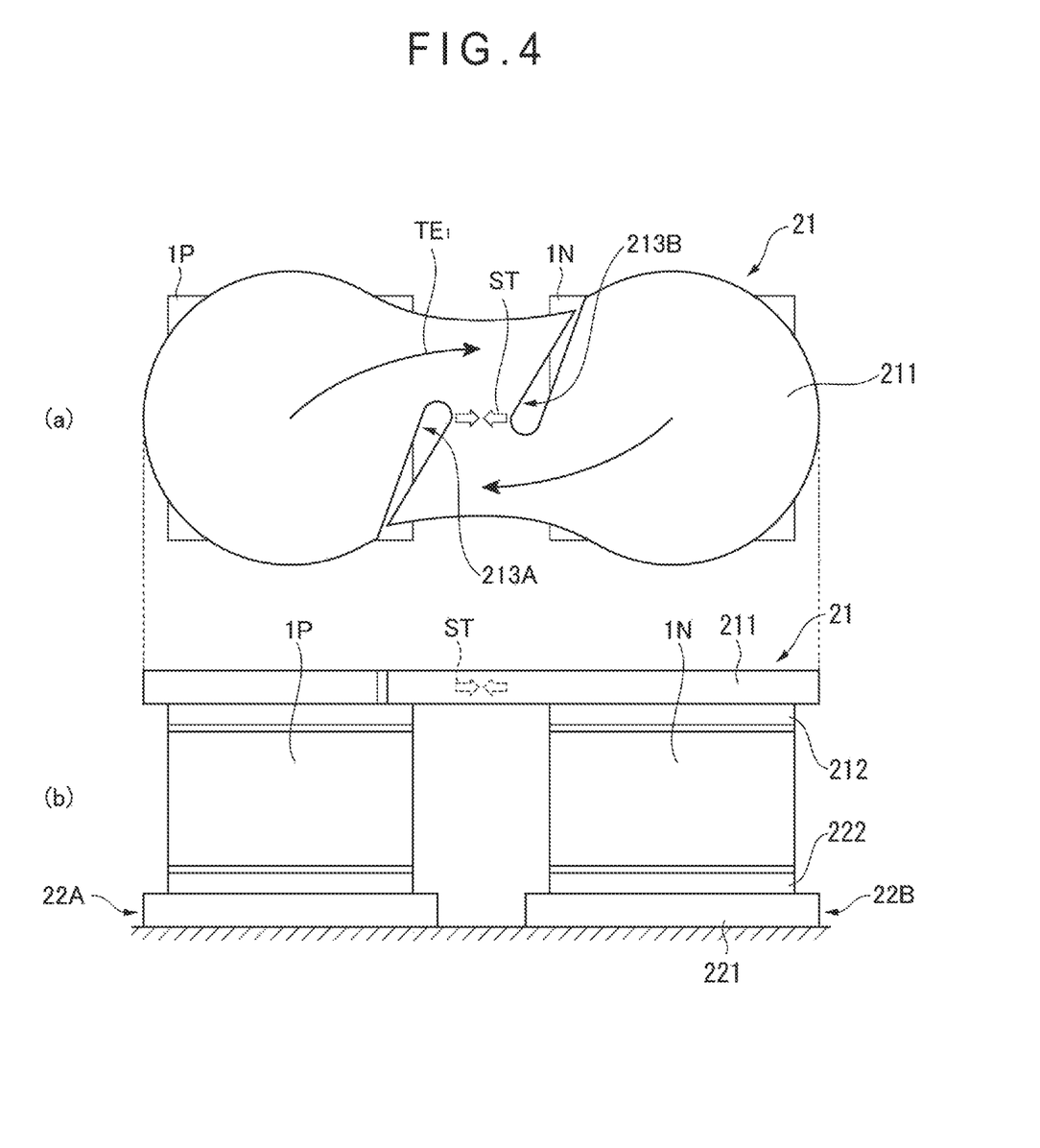
FIG. 4 shows the upper electrode shown in FIG. 3 in which thermal stress has occurred.
Figure 5:
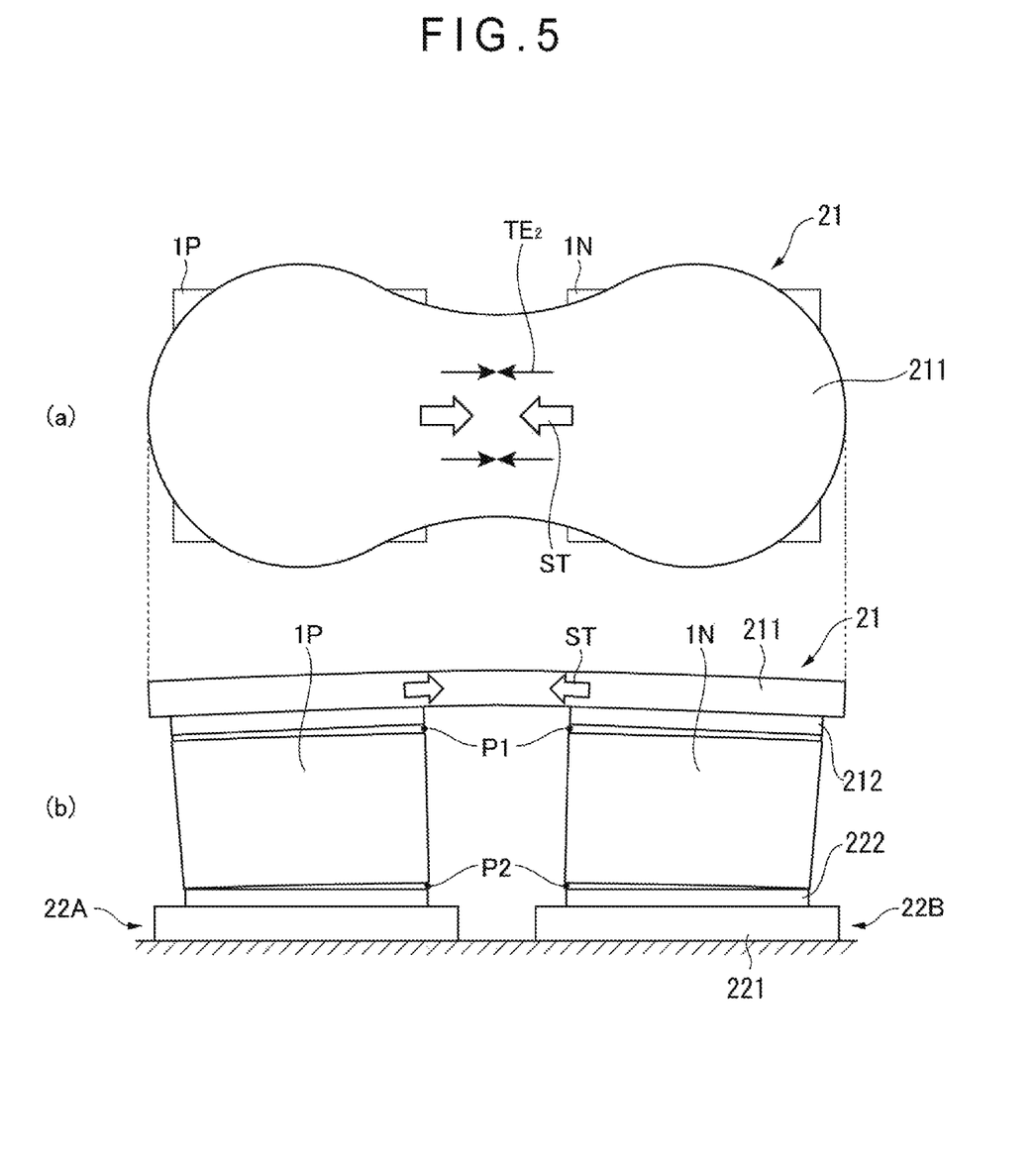
FIG. 5 shows an upper electrode having no cutout in which thermal stress has occurred, as a comparative example to the example shown in FIG. 4.

FIG. 4 shows the upper electrode 21 shown in FIG. 3 in which thermal stress ST has been caused. Side views in FIG. 4(b) and FIG. 5(b) show a pair of bases 212 extending from a lower surface of the body 211 of the upper electrode 21 to be bonded to upper end surfaces of the P-type thermoelectric element 1P and the N-type thermoelectric element 1N. Moreover, the side views in FIG. 4(b) and FIG. 5(b) also show the lower electrode 22A bonded to a lower end surface of the P-type thermoelectric element 1P, and the lower electrode 22B bonded to a lower end surface of the N-type thermoelectric elements 1N. The lower electrodes 22A and 22B each have the same body 221 and bases 222 as the body 211 and the bases 212 of the upper electrode 21. Although not shown in the figure, the lower electrode 22A is also bonded to an N-type thermoelectric element different from the N-type thermoelectric element 1N shown in the figure while the lower electrode 22B is also bonded to a P-type thermoelectric element different from the P-type thermoelectric element 1P shown in the figure.

As described above, when the thermoelectric module 10 is operated, the temperature of the silicon wafer 110 is controlled to the target temperature by causing heat absorbing phenomenon or heat radiating phenomenon in the upper electrode 21. At this time, since heat is exchanged between the silicon wafer 110 and the upper electrode 21 through the electrostatic chuck 104 and the polyimide film 3, the temperature of the upper electrode 21 would become high if the target temperature is high. The body 211 of the upper electrode 21 then thermally expands along an arrow $TE_1$ shown in the figure while deforming the polyimide film 3 as described above. On the other hand, the P-type thermoelectric element 1P and the N-type thermoelectric element 1N bonded to the upper electrode 21 are mechanically bound by being fixed to the substrate through the respective lower electrodes 22. Accordingly, thermal stress ST occurs at a part of the upper electrode 21 disposed between the P-type thermoelectric element 1P and the N-type thermoelectric element 1N.

However, in the upper electrode 21 of the thermoelectric module 10 according to the exemplary embodiment, since parts of the upper electrode 21 defining the cutouts 213A, 213B are deformed, the thermal expansion of the body 211 is unlikely to be blocked even when the P-type thermoelectric element 1P and the N-type thermoelectric element 1N are bound. Consequently, a reduced thermal stress ST occurs.

In contrast, FIG. 5 shows occurrence of thermal stress ST in the upper electrode 21, in which the cutouts 213A, 213B are not formed, as a comparative example to the example shown in FIG. 4. In this arrangement, although the body 211 of the upper electrode 21 thermally expands along arrows $TE_2$ shown in the figure, the thermal expansion is blocked since the P-type thermoelectric element 1P and the N-type thermoelectric element 1N are mechanically bound to the upper electrode 21. Consequently, a large thermal stress ST occurs at a part of the upper electrode 21, the part being at a position between the P-type thermoelectric element 1P and the N-type thermoelectric element 1N. As shown in the figure, the upper electrode 21 is deformed in an arc by the thermal stress ST such that a central part of the upper electrode 21 in the longitudinal direction is raised. This deformation causes a large stress (a combined stress of tensile stress and shearing stress) at joint portions P1 between the bases 212 of the upper electrode 21 and the upper end surface of the thermoelectric elements 1 and at joint portions P2 between the bases 222 of the lower electrodes 22A, 22B and the lower end surfaces of the thermoelectric elements 1.

Next, a change in the stress of the upper electrode 21 caused by forming the cutouts 213A, 213B described above was examined by numerical analysis. Specifically, when the cutouts 213A, 213B each having a 0.3-mm width were formed in the upper electrode 21 having a 8-mm length, a 2.9-mm width, and a 0.6-mm thickness (including the 0.4-mm thick body 211 and the 0.2-mm thick bases 212), and when a temperature of the upper electrode 21 was fixed at 60 degrees C. while a temperature of the upper electrode 21 was fluctuated between 60 degrees C. and 120 degrees C., an amplitude of stress occurring at a joint portion (joint portion P1 shown in FIG. 5) between the bases 212 of the upper electrode 21 and the end surfaces of the thermoelectric elements 1 was calculated.

Figure 6:
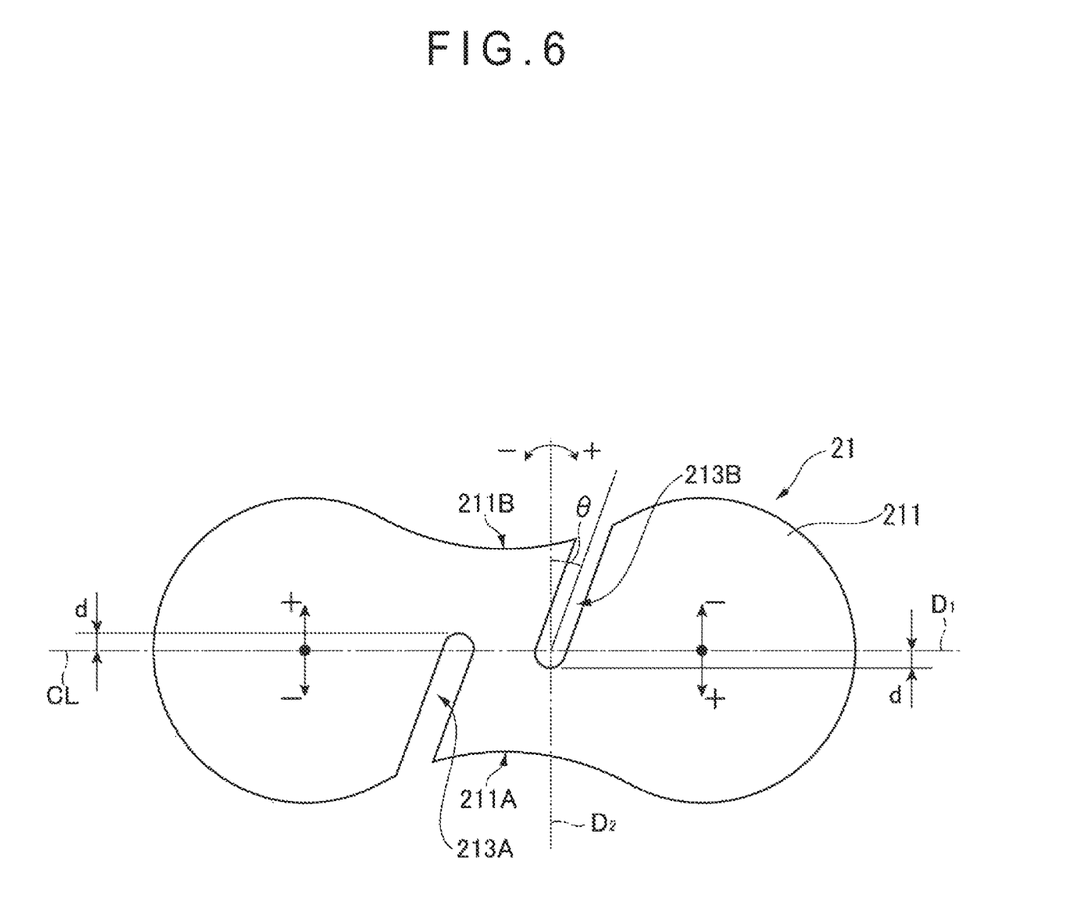
FIG. 6 illustrates definitions of a depth and an angle of slit cutouts formed in the upper electrode in the exemplary embodiment of the invention.

FIG. 6 illustrates definitions of a depth d and an angle θ of the slit cutouts 213A, 213B formed in the upper electrode 21 in the exemplary embodiment. As shown in the figure, the depth d of the cutouts 213A and 213B is defined as a distance between the center line CL of the upper electrode 21 and the innermost of the cutouts 213A and 213B in the width direction $D_2$. In the following description, the depth d is defined as zero when the innermost of each of the cutouts 213A, 213B reaches the center line CL, defined as d>0 when the innermost of each of the cutouts 213A, 213B extends beyond the center line CL, and defined as d<0 when the innermost of each of the cutouts 213A, 213B does not reach the center line CL. It should be noted that the cutouts 213A, 213B have the same depth d in an analysis described below.

Figure 7:
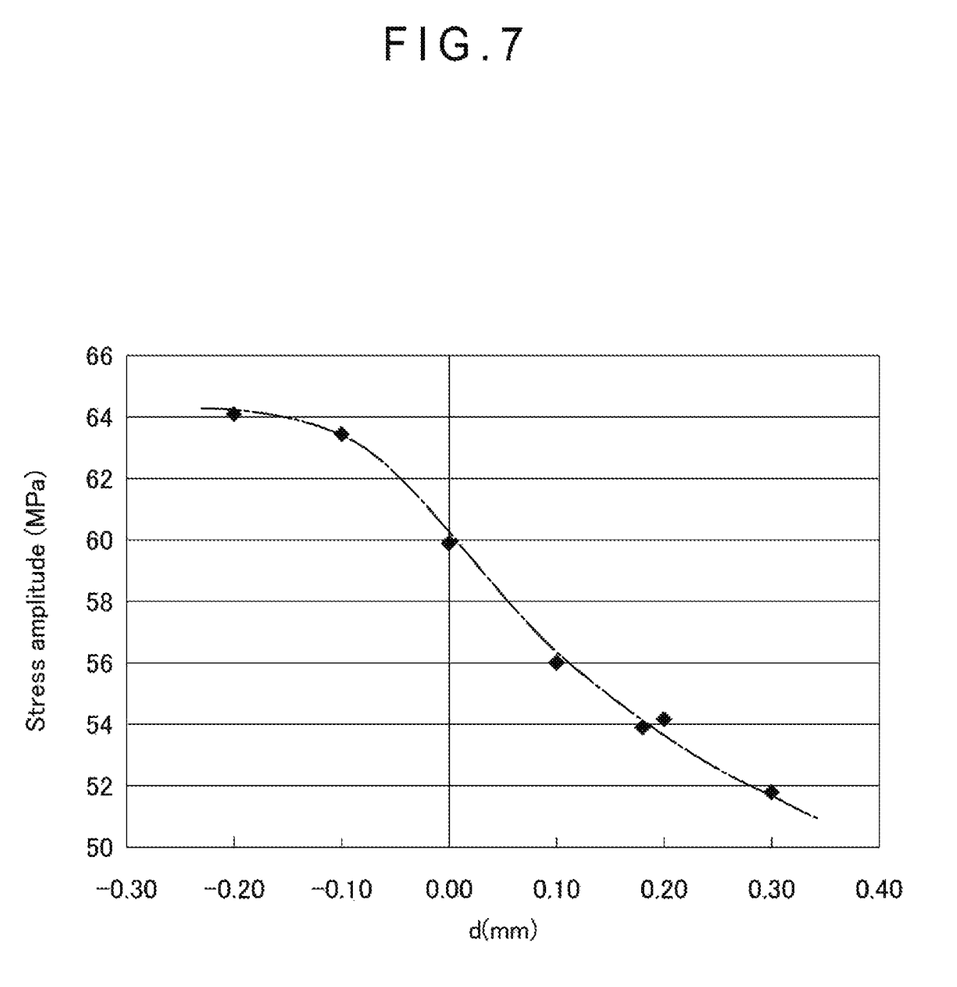
FIG. 7 is a graph showing a relationship between the depth of the slit cutouts defined as shown in FIG. 6 and a stress occurring in the upper electrode.

FIG. 7 is a graph showing a relationship between the depth d of the slit cutouts defined as shown in FIG. 6 and the stress occurring in the upper electrode 21. It should be noted that the angle θ of each of the cutouts 213A, 213B was determined as 20 degrees in the analysis of the depth d. As shown in the graph of FIG. 7, at d<0, specifically, when the upper electrode 21 has a section where neither the cutout 213A nor the cutout 213B is present between the first side 211A and the second side 211B of the upper electrode 21 viewed in the width direction $D_2$, a value of the amplitude of the stress occurring at the joint portion between the bases 212 of the upper electrode 21 and the end surfaces of the thermoelectric elements 1 is relatively large (64.2 MPa at d=−0.20 mm, 63.5 MPa at d=0.10 mm). In contrast, at d=0, specifically, when one of the cutout 213A and the cutout 213B is present within the section $S_1$ defined between the first side 211A and the second side 211B of the upper electrode 21 viewed in the width direction $D_2$, the amplitude of the stress is smaller than that in the above arrangement (59.9 MPa). Further, at d>0, specifically, when both of the cutout 213A and the cutout 213B are present in the partial section $S_2$ between the first side 211A and the second side 211B of the upper electrode 21, the amplitude of the stress is further decreased (56.0 MPa at d=0.10 mm, 53.9 MPa at d=0.18 mm, 54.2 MPa at d=0.20 mm, and 51.7 MPa at d=0.30 mm).

According to the above result, it is found effective for decreasing the stress occurring at the joint portion between the thermoelectric elements 1 and the electrodes 2 due to the thermal expansion of the upper electrode 21 that one of the cutout 213A and the cutout 213B is present within the section $S_1$ between the first side 211A and the second side 211B of the upper electrode 21 viewed in the width direction $D_2$. The stress occurring at the joint portion between the thermoelectric elements 1 and the electrodes 2 due to the thermal expansion of the upper electrode 21 is further reducible by both of the cutout 213A and the cutout 213B present in the partial section $S_2$ between the first side 211A and the second side 211B.

Further referring back to FIG. 6, the angle θ of each of the cutouts 213A and 213B refers to an angle formed between the width direction $D_2$ and a direction in which the corresponding one of the cutouts 213A and 213B extends. When the cutouts 213A and 213B extend in parallel with the width direction $D_2$, in other words, perpendicularly to the longitudinal direction $D_1$, the angle θ becomes zero. When the cutouts 213A and 213B extend toward each other in a direction inclined with respect to the width direction $D_2$ and the longitudinal direction $D_1$, the angle becomes θ>0. Herein, when the cutouts 213A and 213B extend toward each other, the cutouts 213A and 213B come closer to each other as approaching the center line CL. On the other hand, when the cutouts 213A and 213B extend away from each other in a direction inclined with respect to the width direction $D_2$ and the longitudinal direction $D_1$, the angle becomes θ<0. Herein, when the cutouts 213A and 213B extend away from each other, the cutouts 213A and 213B come away from each other as approaching the center line CL. It should be noted that the cutouts 213A, 213B extend substantially in parallel with each other, in other words, substantially at the same angle θ in the analysis described below.

Figure 8:
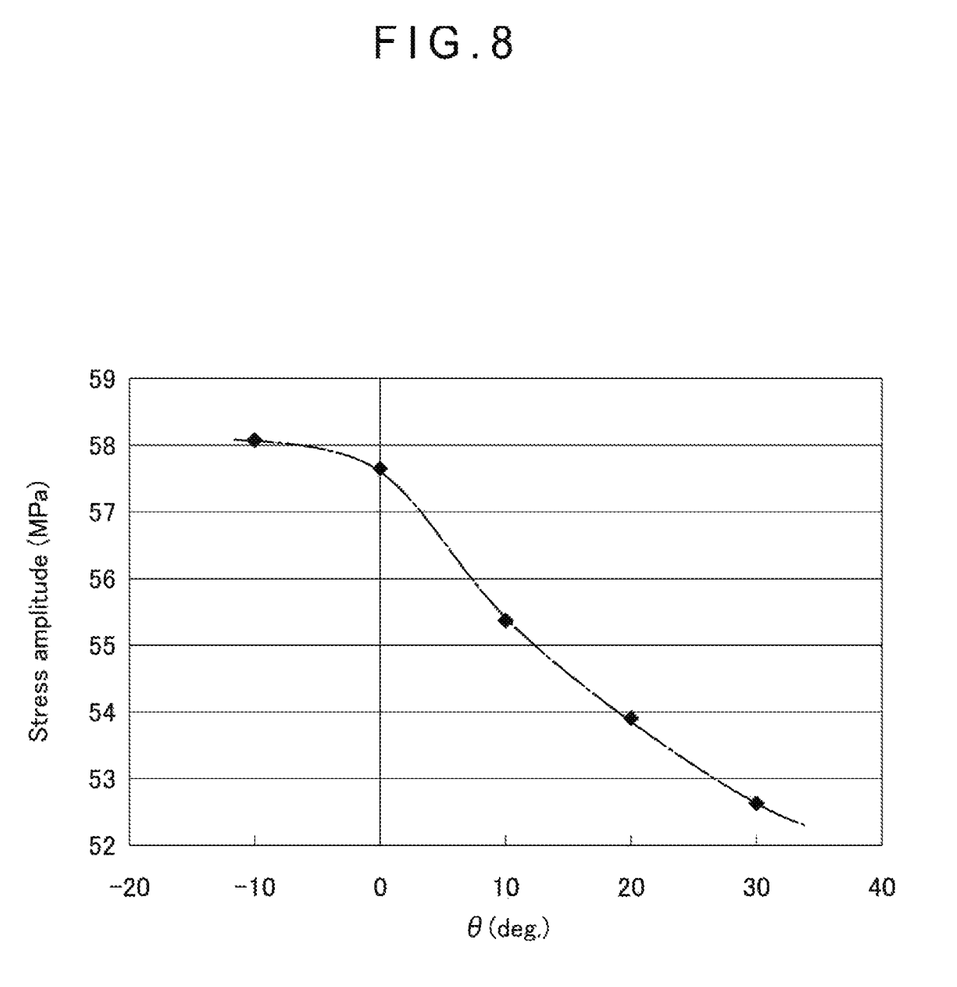
FIG. 8 is a graph showing a relationship between the angle of the slit cutouts defined as shown in FIG. 6 and the stress occurring in the upper electrode.

FIG. 8 is a graph showing a relationship between the angle θ of the slit cutouts 213A, 213B defined as shown in FIG. 6 and the stress occurring in the upper electrode 21. It should be noted that the depth d of the cutouts 213A, 213B is set at 0.18 mm in the analysis of the angle θ. As shown in the graph of FIG. 8, at d≤0, specifically, when the cutouts 213A, 213B extend perpendicularly to the longitudinal direction $D_1$ or extend away from each other, the value of the amplitude of the stress occurring at the joint portion between the bases 212 of the upper electrode 21 and the end surfaces of the thermoelectric elements 1 is relatively large (58.1 MPa at θ=−10 degrees, 57.7 MPa at θ=0). In contrast, at θ>0, specifically, when the cutouts 213A, 213B extend toward each other in the direction inclined with respect to the longitudinal direction $D_1$, the amplitude of the stress is decreased as the angle θ is increased (55.4 MPa at θ=10 degrees, 53.9 MPa at θ=20 degrees, 52.6 MPa at θ=30 degrees).

According to the above result, it is found effective for decreasing the stress occurring at the joint portion between the thermoelectric elements 1 and the electrodes 2 due to the thermal expansion of the upper electrode 21 that the cutout 213A and the cutout 213B extend toward each other in the direction inclined with respect to the longitudinal direction $D_1$ of the upper electrode 21.

In the thermoelectric module 10, the upper electrode 21 functions to transfer heat between the polyimide film 3 and the thermoelectric elements 1 while electrically connecting the P-type thermoelectric elements 1P and the N-type thermoelectric elements 1N. Since a part of the upper electrode 21 where the cutouts 213A, 213B are present is in no contact with the polyimide film 3, a volume of heat transferrable by the upper electrode 21 is decreased as an area of the cutouts 213A, 213B occupying the upper electrode 21 is increased. Moreover, although depending on the depth d and the angle θ of the cutouts 213A, 213B, an electric resistance between the P-type thermoelectric elements 1P and the N-type thermoelectric elements 1N is increased as the area of the cutouts 213A, 213B is increased.

Accordingly, in consideration of a plane including the longitudinal direction $D_1$ and the width direction $D_2$ of the upper electrode 21, it is desirable to determine a shape of the cutouts 213A, 213B so that a ratio (Ss/Sd) of the total area (Ss) of the cutouts 213A, 213B to an area (Sd) of the upper electrode 21 is equal to or less than a predetermined value. According to the findings of the inventors, in order that the thermoelectric module 10 exhibits a sufficient performance in the plasma processor 100 shown in FIG. 1, the ratio (Ss/Sd) of the total area (Ss) of the cutouts 213A, 213B to the area (Sd) of the upper electrode 21 is desirably less than 0.33 (⅓). For instance, the ratio (Ss/Sd) of the total area (Ss) of the cutouts 213A, 213B to the area (Sd) of the upper electrode 21 shown in FIG. 3 is 0.18.

According to the above-described exemplary embodiment, the stress occurring at the joint portion between the thermoelectric elements 1 and the electrodes 2 is reducible by the thermal expansion of the upper electrode 21 of the thermoelectric module 10.

It should be understood that the invention is not restricted to the above-described exemplary embodiment, but includes modifications and improvements as long as an object of the invention can be achieved.

In the above exemplary embodiment, the upper electrode 21 is bonded to the polyimide film 3 and the lower electrode 22 is fixed to the substrate on the lower side of the thermoelectric module 10. However, for instance, in some embodiments, the lower electrode 22 is also bonded to the substrate through a polyimide film. In this arrangement, since the lower electrode 22 also can expand while deforming the polyimide film, the stress occurring at the joint portion between the thermoelectric elements 1 and the electrodes 2 is reducible by forming the same cutouts in the lower electrode 22 as in the upper electrode 21. In this arrangement, the cutouts may be formed in both of the upper electrode 21 and the lower electrode 22, or alternatively, may be formed only in the lower electrode 22.

Further in the above exemplary embodiment, a single cutout 213A is formed at the first side 211A and a single cutout 213B is formed in the second side 211B of the upper electrode 21 in the width direction $D_2$. However, for instance, in some embodiments, a plurality of cutouts are formed at each of the first side 211A and the second side 211B.

Further in the above exemplary embodiment, the cutouts 213A and 213B formed in the upper electrode 21 have the same depth d. However, for instance, in some embodiments, the depth d of the cutout 213A is different from the depth d of the cutout 213B. Likewise, in the above exemplary embodiment, the cutouts 213A and 213B extend substantially at the same angle θ. However, for instance, in some embodiments, the cutouts 213A and 213B extend at different angles θ.

Further in the above exemplary embodiment, the cutouts formed at the first side 211A and the second side 211B of the upper electrode 21 are exemplarily described as linear slits. However, the shape of each cutout is not necessarily a linear slit. For instance, in some embodiments, each cutout is shaped in a slit having a curved portion or bent portion. Alternatively, in some embodiments, each cutout has a V-shape so as to be widened toward the first side 211A or the second side 211B, while the electrode(s) having a sufficient area except for the cutouts in consideration of the heat transfer and the electrical resistance between the thermoelectric elements as described above.

Other configurations and arrangements are applicable to the invention as long as an object of the invention is achievable.

The invention claimed is:

1. A thermoelectric module comprising:
a first thermoelectric element;
a second thermoelectric element;
a first electrode that electrically connects the first thermoelectric element to the second thermoelectric element, the first electrode comprising a body that has a plate shape, the body having a first surface that is bonded to a first end surface of the first thermoelectric element and a first end surface of the second thermoelectric element;
a second electrode bonded to a second end surface of the first thermoelectric element opposite the first end surface thereof;
a third electrode bonded to a second end surface of the second thermoelectric element opposite the first end surface thereof; and
a polyimide film bonded to a second surface of the body of the first electrode, the second surface being opposite to the first surface of the body of the first electrode, wherein:
the first electrode comprises: a first cutout formed at a first side in a width direction with respect to a longitudinal direction connecting a center of the first end surface of the first thermoelectric element to a center of the first end surface of the second thermoelectric element; and a second cutout formed at a second side in the width direction, a part of the first cutout is formed at a position overlapping with the first end surface of the first thermoelectric element in a plan view, and a part of the second cutout is formed at a position overlapping with the first end surface of the second thermoelectric element in the plan view, in the width direction, at least one of the first cutout or the second cutout is present in a section between the first side and the second side of the first electrode, the first and second cutouts extend toward each other along an extension direction inclined with respect to the longitudinal direction, and an angle formed by the width direction and the extension direction of each of the first and second cutouts is an acute angle.

2. The thermoelectric module according to claim 1, wherein, in the width direction, both of the first cutout and the second cutout are present in a partial section defined between the first side and the second side of the first electrode.

3. The thermoelectric module according to claim 1, wherein the first and second cutouts extend substantially in parallel with each other.

4. The thermoelectric module according to claim 1, wherein a value of a ratio of a total area of the first and second cutouts to an area of the first electrode in a plane defined by the longitudinal direction and the width direction is less than 0.33.

5. The thermoelectric module according to claim 1, wherein the acute angle is greater than or equal to 10 degrees.

6. The thermoelectric module according to claim 5, wherein the acute angle is less than or equal to 30 degrees.

7. The thermoelectric module according to claim 1, wherein the first cutout extends from the position corresponding to the first end surface of the first thermoelectric element to a position that is laterally outside a side surface of the first thermoelectric element facing a side surface of the second thermoelectric element, and wherein the second cutout extends from the position corresponding to the first end surface of the second thermoelectric element to a position that is laterally outside the side surface of the second thermoelectric element.

8. The thermoelectric module according to claim 1, wherein the first cutout extends toward the second cutout and passes a side surface of the first thermoelectric element facing a side surface of the second thermoelectric element, and wherein the second cutout extends toward the first cutout and passes the side surface of the second thermoelectric element.

9. The thermoelectric module according to claim 1, further comprising:

a first base disposed between the first end surface of the first thermoelectric element and the first electrode; and a second base disposed between the first end surface of the second thermoelectric element and the first electrode, wherein the first cutout extends toward the second cutout and passes a side surface of the first base facing a side surface of the second base, and wherein the second cutout extends toward the first cutout and passes the side surface of the second base.

10. The thermoelectric module according to claim 1, wherein another part of the first cutout is formed at a position laterally outside the first end surface of the first thermoelectric element, and another part of the second cutout is formed at a position laterally outside the first end surface of the second thermoelectric element.

11. The thermoelectric module according to claim 1, wherein the first electrode is configured to thermally expand while deforming the polyimide film.

12. The thermoelectric module according to claim 1, wherein the first electrode is located between the polyimide film and each of the first thermoelectric element and the second thermoelectric element.

13. The thermoelectric module according to claim 1, wherein the polyimide film is in contact with and extends along the second surface of the body of the first electrode and covers an entirety of the second surface of the body of the first electrode.

14. The thermoelectric module according to claim 13, wherein a horizontal width of the polyimide film is greater than horizontal widths of the first electrode, the second electrode, and the third electrode.

* * * * *